United States Patent
Cheng et al.

(10) Patent No.: US 6,194,324 B1
(45) Date of Patent: Feb. 27, 2001

(54) METHOD FOR IN-SITU REMOVING PHOTORESIST MATERIAL

(75) Inventors: Lung-Yi Cheng, Taipei; Yuan-Chi Pai, Nantou Hsien; Cheng-Che Li, Taitung; Wei-Chiang Lin, Hsinchu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/292,292

(22) Filed: Apr. 15, 1999

(51) Int. Cl.[7] .................................................. H01L 21/302
(52) U.S. Cl. .......................... 438/725; 438/958; 134/1.2
(58) Field of Search .................. 438/706, 714, 438/725, 958; 510/175, 176, 178; 134/1.2, 1.3

(56) References Cited

U.S. PATENT DOCUMENTS 5,416,754 * 5/1995 Washo ................................. 369/13
5,589,962 * 12/1996 Yamamoto et al. ................. 349/46
5,756,239 * 5/1998 Wake .................................... 430/7
5,972,862 * 10/1999 Torii et al. ........................ 510/175

* cited by examiner

Primary Examiner—Benjamin L. Utech
Assistant Examiner—Kin-Chan Chen
(74) Attorney, Agent, or Firm—Martine Penilla & Kim, LLP

(57) ABSTRACT

A method for in-situ removing photoresist material. An etching process for patterning a passivation layer of a CMOS photosensor is performed on an etching machine. Oxygen is in-situ used to remove the parched photoresist material. The etching process and the in-situ $O_2$ process are performed, for example, on a Tegal-903 etching machine. The Tegal-903 has better stability than an Asher etching machine for removing the parched photoresist material using oxygen plasma. A stable etching rate is thus obtained to prevent the acrylic material layer from being damaged by over-etching and to prevent the photoresist material from remaining.

16 Claims, 1 Drawing Sheet

METHOD FOR IN-SITU REMOVING PHOTORESIST MATERIAL

BACKGROUND OF THE INVENTION

1. Field of the Invention

This invention in general relates to a process for removing photoresist material and particularly relates to a process for removing photoresist material in the manufacture of a CMOS (Complementary Metal-Oxide Semiconductor) photosensor.

2. Description of the Related Art

Conventionally, a charge-coupled device is used in a digital sensor. However, due to the cost and the size of the charge-coupled device, the CMOS photosensor has been recently developed.

A CMOS photosensor is electrically connected with other devices or other CMOS photosensors. A cover layer is used to protect and isolate the photosensitive area in the substrate to prevent electrical contact from the contact pad thereon. In such a case, the cover layer comprises a color filter layer for filtering a certain wavelength of light and an acrylic material layer as a planarization layer or a protective layer for the color filter layer.

In a conventional semiconductor fabrication, silicon glass or silicon nitride lies under the photoresist material. While removing the photoresist material using a plasma enhanced method, if the plasma contains oxygen, the silicon glass or silicon nitride doesn't react with oxygen. However, since the properties of acrylic material are similar to those of the photoresist material, it is difficult to remove the photoresist material by plasma without damaging the acrylic material layer after formation of an opening on metal pad by photolithography. Therefore, it is suggested that the photoresist material be removed using a solvent.

The photoresist material easily remains when the plasma is not used because the nature of the photoresist material changes after the ion-bombardment of plasma in the etching process. The surface of the photoresist material is parched. Thus, the photoresist material cannot be sufficiently removed by solvent. For example, after the etching process for patterning a passivation layer of a CMOS photosensor, the CMOS photosensor is removed to an Asher etching machine. The parched photoresist material is removed by oxygen plasma in the Asher etching machine. The remaining photoresist material is removed using solvent.

However, the Asher etching machine cannot precisely control a stable etching rate while etching the parched photoresist material. Etching temperature is increased according to etching time so that the etching rate is increased. Over-etching thus happens easily and the acrylic material layer may be damaged. Therefore, it is difficult to control etching time. Because of photoresist material remaining or acrylic material layer damage, the cover layer cannot maintain a planar form. In such a case, the light transmitted through the photosensor is interrupted, and the photosensitivity of the photosensor is thus decreased. Therefore, the complete removal of photoresist material on the cover layer in manufacturing a CMOS photosensor is desired, especially in industry-scale production.

SUMMARY OF THE INVENTION

The invention provides a method for in-situ removing a photoresist material. An etching process for patterning a passivation layer of a CMOS photosensor is performed on an etching machine. Oxygen is in-situ used to remove the parched photoresist material. The etching process and the in-situ $O_2$ process are performed, for example, on a Tegal-903 etching machine. The Tegal-903 has better stability than an Asher etching machine for removing the parched photoresist material using oxygen plasma. A stable etching rate is thus obtained to prevent the acrylic material layer from being damaged by over-etching and to prevent the photoresist material from remaining.

Furthermore, the step of patterning the CMOS photosensor and the step of removing the parched photoresist material are performed on the same etching machine so that the CMOS photosensor need not be transferred to another etching machine. Fabricating time for forming the CMOS photosensor is thus saved. Moreover, external influence from the environment is decreased.

The invention performs the step of patterning a passivation layer of a CMOS photosensor using a Tegal-903 etching machine. In-situ oxygen plasma is provided to remove part of the photoresist material, which is parched while performing the patterning step. A solvent is then used to effectively remove other photoresist material above a polyacrylate layer of the CMOS photosensor. The in-situ oxygen plasma step is also used to remove a parched photoresist material for fabricating a general semiconductor device. Before using a solvent to remove the photoresist material, the in-situ oxygen plasma step is used to replace a step of plasma enhanced etching for removing photoresist.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
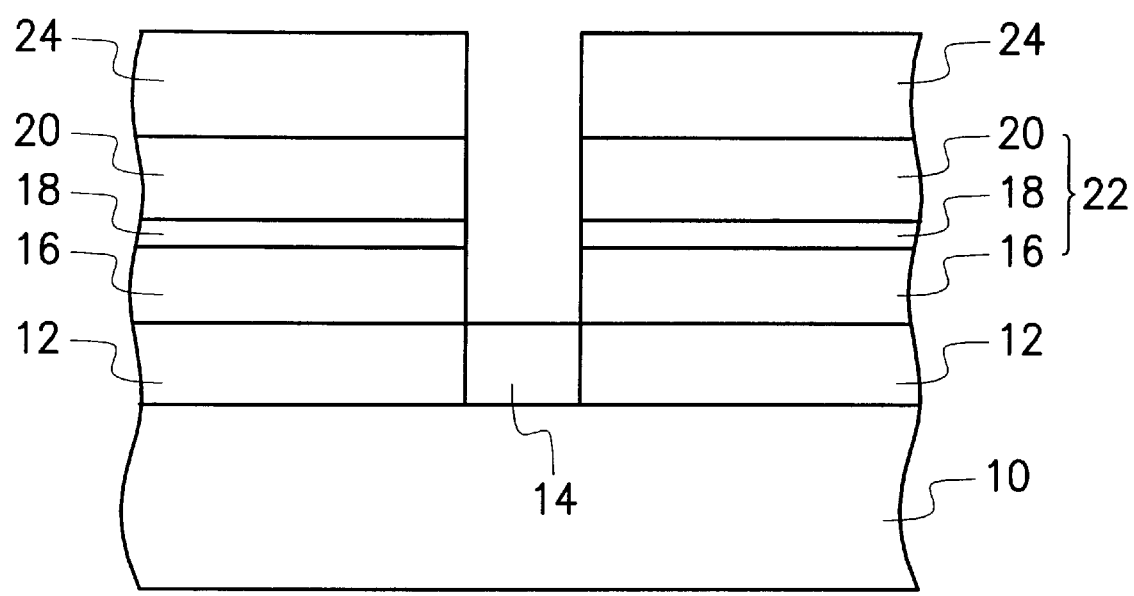
FIG. 1 is a schematic, cross-sectional view showing the structure of a CMOS photosensor, which comprises a photoresist material thereon for patterning a passivation layer of the CMOS photosensor.

A CMOS photosensor is electrically connected with other devices or other CMOS photosensors. A cover layer is used to protect and isolate the photosensitive area in the substrate to prevent electrical contact from the contact pad thereon. In such a case, the cover layer comprises a color filter layer for filtering a certain wavelength of light and an acrylic material layer as a planarization layer or a protective layer for the color filter layer.

FIG. 1 is a schematic, cross-sectional view showing the structure of a CMOS photosensor, which comprises a photoresist material thereon for patterning a passivation layer of the CMOS photosensor. In FIG. 1, symbol 10 represents a part of a structure of the CMOS photosensor positioned under a sensor region 12 and a pad 14. A cover layer 22, which comprises a first protective layer 16, a filter layer 18 and a second protective layer 25, is provided on the sensor region 12 and the pad 14. Materials of the cover layer 22 should be light-transmissive. Preferably, the materials of the cover layer 22 are acrylic materials. A material of the filter layer 18 is adjusted for filtering a certain wavelength of light.

In order to connect to an external device, a part of the cover layer 22 positioned on the pad 14 must be removed. A photoresist layer 24 is provided to define the cover layer 22. After defining the cover layer 22, an etching process is performed to remove the cover layer 22 on the pad 14 as the structure shown in the FIGURE. The etching process is preferably performed on a Tegal-903 etching machine. After performing the etching process to remove a part of the cover layer 22, the photoresist layer 24 is removed.

Since the surface of the photoresist layer 24 is damaged and parched during the etching process, the photoresist layer 24 cannot be easily removed using a solvent. Furthermore, the remaining cover layer 22 under the photoresist layer 24 may be damaged if plasma is used to enhance the ability of the solvent for removing the photoresist layer 24. The invention removes the parched photoresist layer 24 on the same etching machine, for example, on the Tegal-903 etching machine. This means the etching process and the step of removing the parched photoresist layer 24 are performed on the same etching machine. The parched photoresist layer 24 is removed using plasma, which contains oxygen. The preferred plasma is oxygen plasma. Parameters for using the plasma comprise a pressure of about 1500–2000 mtorr, wherein the preferred pressure is about 1800 mtorr; a velocity of about 4–16 sccm, wherein the preferred velocity is about 8 sccm; and a power of about 200–500 Watts, wherein the preferred power is about 300 Watts. The step employing the plasma is performed for about 30 seconds. Moreover, a temperature of an upper electrode used to form the plasma is about 22–28 degrees Celsius, wherein the preferred temperature of the upper electrode is about 25 degrees Celsius. A temperature of a lower electrode used to form the plasma is about 17–23 degrees Celsius, wherein the preferred temperature of the lower electrode is about 20 degrees Celsius. A solvent is used to remove the remaining photoresist layer 24. Since the parched photoresist layer is removed, the remaining photoresist layer is easily removed.

The Tegal-903 etching machine has good control over the removal processes. Using the Tegal-903 etching machine to remove the parched photoresist layer, a stable etching rate is obtained to prevent damage to the cover layer under the photoresist layer or to avoid leaving a part of the photoresist layer on the cover layer. Furthermore, the etching process and the step of removing the parched photoresist layer are performed on the same etching machine so that time required to fabricate the CMOS photosensor is saved.

However, in general etching processes for fabricating semiconductor devices, materials under the photoresist layer and the photoresist material have a large etching selectivity. While removing the photoresist layer by a solvent, a step of using plasma to enhance the etching ability of the solvent is performed for a long period of time. The plasma may damage pads of the semiconductor devices. The method of the invention also can be used to remove photoresist material in the general etching process for fabricating the semiconductor devices to further save the cycle time and to prevent damage to the pad.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for in-situ removing a photoresist material, comprising:

providing a patterned photoresist material layer on a target layer;

on an etching machine, etching the target layer using the patterned photoresist material layer as a mask;

on the etching machine, removing a part of the patterned photoresist material layer using an oxygen-containing plasma, the part of the patterned photoresist material layer being removed having a damaged surface from the etching operation; and removing any other patterned photoresist material using a solvent.

2. The method according to claim 1, wherein the etching machine is configured to obtain a stable etching rate.

3. The method according to claim 1, wherein a material of the target comprises acrylic materials.

4. The method according to claim 1, wherein the plasma is used under a pressure of about 1500–2000 mtorr.

5. The method according to claim 1, where in oxygen has a velocity of about 4–16 sccm.

6. The method according to claim 1, wherein the plasma is used with a power of about 200–500 Watts.

7. The method according to claim 1, wherein an upper electrode used to form the plasma is at a temperature of about 22–28 degrees Celsius, and a lower electrode used to form the plasma is at a temperature of about 17–23 degrees Celsius.

8. The method according to claim 1, wherein the plasma is used for about 30 seconds.

9. A method for in-situ removing a photoresist material from a CMOS photosensor, comprising:

providing a patterned photoresist material on a passivation layer of the CMOS photo sensor;

on an etching machine, etching the passivation layer using the patterned photoresist material;

on the etching machine, removing a part of the patterned photoresist material using plasma containing oxygen, the part of the patterned photoresist material being removed having a damaged surface from the etching operation; and removing any other patterned photoresist material using a solvent.

10. The method according to claim 9, wherein the etching machine is configured to obtain a stable etching rate.

11. The method according to claim 9, wherein a material of the passivation layer comprises acrylic materials.

12. The method according to claim 9, wherein the plasma is used under a pressure of about 1500–2000 mtorr.

13. The method according to claim 9, wherein oxygen has a velocity of about 4–16 sccm.

14. The method according to claim 9, wherein the plasma is used with a power of about 200–500 Watts.

15. The method according to claim 9, wherein an upper electrode used to form the plasma is at a temperature of about 22–28 degrees Celsius, and a lower electrode used to form the plasma is at a temperature of about 17–23 degrees Celsius.

16. The method according to claim 9, wherein the plasma is used for about 30 seconds.

* * * * *